US009748966B2

(12) United States Patent
Nagarajan et al.

(10) Patent No.: US 9,748,966 B2
(45) Date of Patent: Aug. 29, 2017

(54) HISTOGRAM BASED ERROR ESTIMATION AND CORRECTION

(71) Applicant: Texas Instruments Incorporated, Dallas, TX (US)

(72) Inventors: Viswanathan Nagarajan, Bangalore (IN); Srinivas Kumar Reddy Naru, Bangalore (IN); Ratna Kumar Venkata Parupudi, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/231,415

(22) Filed: Aug. 8, 2016

(65) Prior Publication Data
US 2017/0041013 A1 Feb. 9, 2017

(30) Foreign Application Priority Data
Aug. 6, 2015 (IN) .......................... 4092/CHE/2015

(51) Int. Cl.
H03M 1/10 (2006.01)
H03M 1/06 (2006.01)
H03M 1/16 (2006.01)

(52) U.S. Cl.
CPC .......... *H03M 1/0641* (2013.01); *H03M 1/168* (2013.01)

(58) Field of Classification Search
CPC ........ H03M 1/004; H03M 1/00; H03M 1/001; H03M 1/06

USPC .......................................... 341/120, 118, 155
See application file for complete search history.

(56) References Cited

U.S. PATENT DOCUMENTS

| 9,503,116 B2* | 11/2016 | Speir | H03M 1/128 |
| 2011/0022341 A1* | 1/2011 | Asami | H03M 1/109 |
| | | | 702/75 |
| 2012/0139767 A1* | 6/2012 | Larsen | H03M 1/201 |
| | | | 341/122 |
| 2015/0070198 A1* | 3/2015 | Wang | H03M 1/12 |
| | | | 341/120 |
| 2016/0182075 A1* | 6/2016 | Devarajan | H03M 1/1019 |
| | | | 341/120 |

* cited by examiner

*Primary Examiner* — Peguy Jean Pierre
(74) *Attorney, Agent, or Firm* — Goutham Kondapalli; Charles A. Brill; Frank D. Cimino

(57) ABSTRACT

A system includes an analog-to-digital converter (ADC) including an ADC input terminal; an ADC output terminal; and analog components configured to convert an analog signal received at the ADC input terminal to a digital signal. The system also includes a histogram estimation circuit coupled to the ADC output terminal and configured to generate information on a plurality of codes generated by the ADC and determine a region defining a range of codes corresponding to an occurrence of an error caused by the analog components of the ADC. The system also includes a dither circuit coupled to the ADC input terminal and configured to introduce a dither in the analog signal to generate a modified analog signal.

20 Claims, 7 Drawing Sheets

HISTOGRAM BASED ERROR ESTIMATION AND CORRECTION

CROSS-REFERENCE TO RELATED APPLICATIONS

The present application claims priority to Indian Provisional Patent Application No. 4092/CHE/2015, filed Aug. 6, 2015, titled "Histogram Based Digital To Analog Converter (DAC) Mismatch And Residue Stage Gain Error Estimation," which is hereby incorporated herein by reference in its entirety.

BACKGROUND

An analog-to-digital converter (ADC) converts an analog input voltage to a digital output voltage in the format of a number that represents the amplitude of the analog input voltage. The digital output may use different coding schemes. Various electrical components and circuits may be present in an ADC including additional ADCs, digital-to-analog converters (DACs), and gain amplifiers. During the manufacturing process of these components, it may difficult to produce components that perform uniformly across varying temperature and across different power supplies.

SUMMARY

A system includes an analog-to-digital converter (ADC) including an ADC input terminal; an ADC output terminal; and analog components configured to convert an analog signal received at the ADC input terminal to a digital signal. The system also includes a histogram estimation circuit coupled to the ADC output terminal and configured to generate information on a plurality of codes generated by the ADC and determine a region defining a range of codes corresponding to an occurrence of an error caused by the analog components of the ADC. The system also includes a dither circuit coupled to the ADC input terminal and configured to introduce a dither in the analog signal to generate a modified analog signal.

Another system includes a pipeline analog-to-digital converter (ADC) including a stage including a flash ADC including an input configured to receive an analog signal; a digital-to-analog converter (DAC) including a DAC input configured to receive a digital signal from the flash ADC; and a gain amplifier configured to amplify a difference between an output signal from the DAC and the analog signal. The system also includes a dither circuit coupled to the input of the ADC and configured to introduce a dither in the analog signal to generate a modified analog signal. The system also includes an estimation circuit coupled to an output of the pipeline ADC and configured to determine a direction of error correction based on information provided by the introduction of the dither in the analog signal and information of a plurality of codes output by the pipeline ADC in a target region.

A method of correcting errors in analog components of an analog-to-digital converter (ADC) including converting a first modified signal including a first analog signal combined with a first dither to a first digital signal and converting a second modified input signal including a second analog signal combined with a second dither to a second digital signal. The method also includes generating a first histogram including a plurality of codes generated by the ADC corresponding to the first digital signal without the first dither and generating a second histogram including a plurality of codes generated by the ADC corresponding to the second digital signal without the second dither. The method also includes determining a region in which an output of a flash ADC of the ADC changes based on a plurality of residue data of the flash ADC; and determining a direction of error correction based on the comparison of a plurality of codes between the first histogram and the second histogram at the region.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

Figure 1:
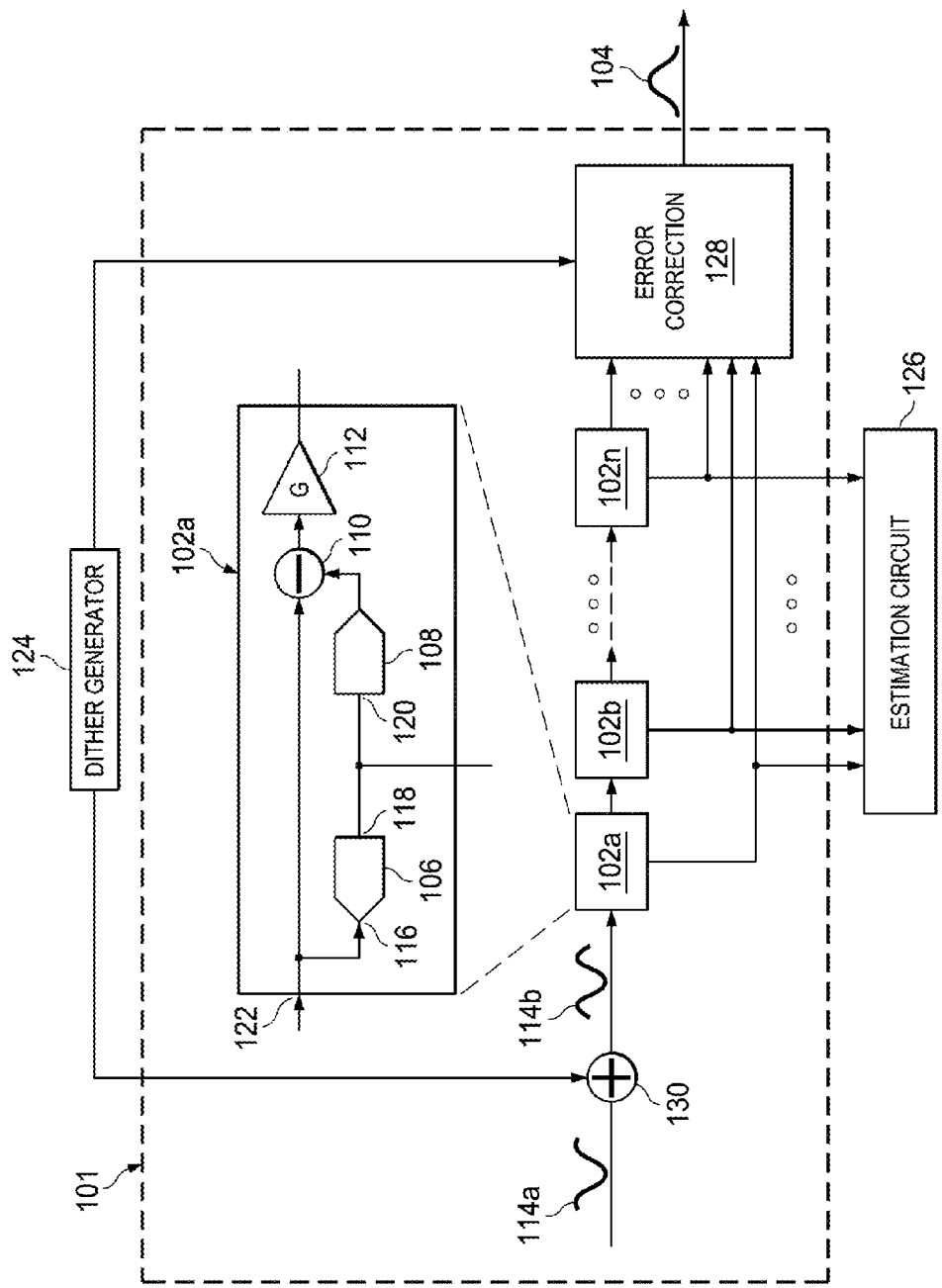
FIG. 1 illustrates an analog-to-digital converter (ADC) in accordance with various examples.

FIG. 1 illustrates an analog-to-digital converter (ADC) 101 in accordance with various embodiments. The ADC 101 converts analog voltage to a digital number or code and may be used in various end equipment such as in Multi-Band, Multi-Mode 2G, 3G, 4G cellular receivers, phased array radar, electronic warfare, cable infrastructure, broadband wireless, high-speed digitizers, software-defined radio, communications test equipment, microwave and millimeter waver receivers, etc. The ADC 101 may support RF sampling with input frequencies around 4 GHz and beyond.

In various embodiments, the ADC 101 is a pipeline ADC with multiple stages 102a, 102b, . . . , 102n. Although ADC 101 is depicted as a pipeline ADC, various other embodiments may include other types of ADCs including a successive approximation ADC, flash ADC, etc.

Continuing with the example where the ADC 101 is a pipeline ADC, each stage 102a, 102b, . . . 102n may resolve bits in different positions of the final output 104 of the ADC 101. Each stage, taking stage 102a as an example, comprises a flash ADC 106, DAC 108, subtractor 110, and a gain amplifier 112. Each flash ADC in each stage resolves a few bits per stage and the final digital output of the pipeline ADC is constructed using the outputs of each of the flashes of the stages 102a, 102b, . . . , 102n in the pipeline ADC. Thus, in an example where the pipeline ADC has a resolution of 14 bits where an analog input signal 114a is converted to a 14 bit digital signal, stage 102a may resolve the left-most bits or three most significant bits of the ADC output 104. The flash ADC in the next stage in the pipeline ADC, flash ADC in stage 102b, may resolve the next three left most bits, etc.

In each stage, taking stage 102a as an example, the flash ADC 106 may quantize an analog signal, such as analog signal 114a, received at the input terminal 122 of stage 102a into three bits. The flash ADC 106 comprises a lower resolution flash than the ADC 101, for example, in some embodiments the flash ADC 106 may output a number of bits, such as three. The bits output by the flash ADC 106 may be part of a code system which represents the value of the received analog voltage value in a digital format. The flash ADC 106 includes an input terminal 116 coupled to the input terminal 122 and an output terminal 118.

The three bit code output of the flash ADC 106 from the output terminal 118 is fed into an input 120 of the DAC 108, which converts the digital output from the flash ADC 106 back into an analog signal. The analog signal output from the DAC 108 may be transmitted to the subtractor 110 which is configured to subtract the DAC 108 output signal from the analog signal received at input terminal 122 (i.e., analog signal 114a) to generate a residue signal. The residue signal is subsequently input through the gain amplifier 112, to generate a gained-up residue (or amplified residue). The residue may be gained up by a certain factor, such as a factor of four, and then the gained-up residue may be input to the next stage, such as stage 102b. The gained-up residue may be referred to as the stage residue. The gained-up residue from each stage continues through the pipeline ADC which provides three bits per stage 102a, 102b, . . . , 102n until all bits, for example all fourteen bits, in the output 104 are resolved.

The ADC 101, whether a pipeline ADC, successive approximation ADC, flash ADC, etc., comprises various internal components that may have some mismatches due to manufacturing tolerances or induced due to operating conditions. The spectral performance of the ADC 101 depends on the performance of the analog components in each stage. For example, in each stage 102a, 102b, . . . , 102n, a mismatch in the DAC 108 or a gain error of the gain amplifier 112 may introduce undesired noise and thus result in degradation in signal-to-noise ratio (SNR) and linearity. Thus, it may be beneficial to incorporate analog components in each stage 102a, 102b, . . . , 102n that are accurate as possible. However, designing analog components that are accurate within a given threshold may be difficult due to limitations in achieving uniformity during the manufacturing stages. Additionally, various operating conditions, such as temperature, differences in supply voltages, etc. may impact the performance of the analog components differently.

In some embodiments, for example where the ADC 101 is a pipeline ADC, the error introduced by the mismatch between analog components in a stage 102a, 102b, . . . , 102n may be detected and corrected. Accordingly, in some embodiments, an error that may be introduced by a mismatch in the analog components in a stage 102a, 102b, . . . , 102n of the ADC 101 that is a pipeline ADC, may be detected through the use of a dither generator 124 (dither circuit) and an estimation circuit 126. Subsequently, the detected error may be corrected by the error correction circuit 128. In various embodiments, where ADC 101 is any type of ADC, errors introduced by a mismatch in the analog components of the ADC 101 may be detected through the use of the dither generator 124 (dither circuit) and the estimation circuit 126 and subsequently the detected error may be corrected by the error correction circuit 128.

In various embodiments, the dither generator 124 or dither circuit may comprise a pseudorandom bit stream (PRBS) generator to introduce the dither. The output of the PRBS generator may be input into a DAC, such as a 1-bit DAC, within the dither generator 124 (dither circuit) such that the dither is added as an analog signal at the adder 130. In various embodiments, the adder 130 may comprise a circuit configured to combine voltages present on multiple inputs into a signal output voltage (i.e., summing amplifier). Thus, an analog signal 114a may be transformed to a modified analog signal 114b which includes the dither from the dither generator 124 (dither circuit).

In some embodiments, the estimation circuit 126 may be coupled to the outputs of each flash ADC in each stage 102a, 102b, . . . , 102n of the pipeline ADC. Thus, the estimation circuit 126 may receive the output of the ADC as it receives each of the resolved bits from each stage in the pipeline ADC. The estimation circuit may comprise various circuits as well as a hardware processor. The estimation circuit 126 may receive the digital output or codes output by the flash ADC 106 and generate a histogram of the number of times a plurality of codes is output by the flash ADC 106 during operation of the ADC. Accordingly, the estimation circuit 126 may be a histogram estimation circuit. This information along with information of the dither added to the analog signal 114a may be used to estimate a direction of error correction to implement in order to correct errors caused by a DAC 108 mismatch or a gain error of the gain amplifier 112 as discussed below.

As previously mentioned, although components and an architecture of a pipeline ADC are discussed in FIG. 1, other ADCs may be used (i.e., successive approximation ADC, flash ADC, etc.). In various embodiments, the estimation circuit 126 is coupled to the output or an output terminal of the ADC 101 and configured to generate information on a plurality of codes generated by the ADC 101. Additionally, the dither generator 124 (dither circuit) is coupled to the input or an input terminal of the ADC 101 and configured to introduce a dither in the analog signal to generate a modified analog signal.

Figure 2:
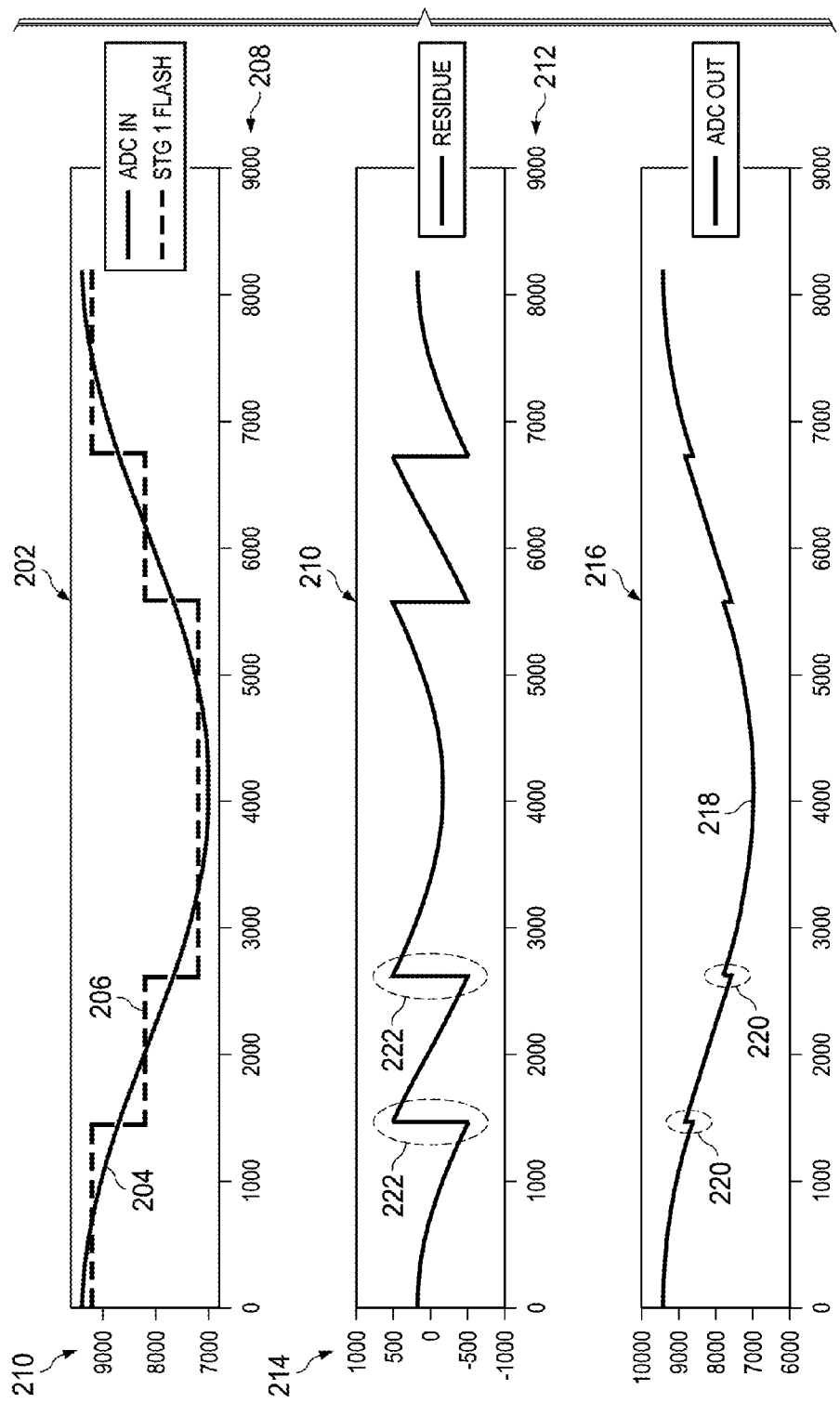
FIG. 2 illustrates voltage waveforms during an operation of the ADC in accordance with various examples.

FIG. 2 illustrates voltage waveforms during an operation of the ADC in accordance with various examples. The graph 204 illustrates waveform 204 corresponding to an analog signal input at the ADC. Graph 204 depicts time 208 along the x-axis, while the codes generated by a flash ADC (e.g., flash ADC 106) in a particular stage (e.g., stage 102a) of the ADC is depicted as waveform 206. Accordingly the flash ADC (e.g., flash ADC 106) converts the analog signal and the corresponding codes output by the flash ADC (e.g., flash ADC 106) is shown.

Graph 210 illustrates corresponding residue produced at the output of a DAC element (e.g., DAC 108) in the stage of the pipeline ADC. The residue represents the difference between the analog signal represented by waveform 204 and the voltage output by the flash ADC (e.g., flash ADC 106) in a particular stage of the pipeline ADC. That is, the output of the DAC (e.g., DAC 108) is subtracted from the analog input, and the result of this is shown as the residue in graph 210. In graph 210, time is depicted along the x-axis 212 and voltage is depicted along the y-axis 214. As can be seen, wherever the flash ADC (e.g., flash ADC 106) transitions, an abrupt change 222 occurs in the residue.

Graph 216 depicts the codes output by the pipeline ADC. Similar to an output of the flash ADC in a given stage of the pipeline ADC, the pipeline ADC will generate an output with a number of bits, such as fourteen, representing a code in a digital format correlating to an input voltage in an analog format. Graph 216 illustrates errors that may occur in a final output of the pipeline ADC due to a mismatch between analog components in the different stages such as a mismatch between the flash ADC 106 and the DAC 108. If analog components in the stages of the ADC, such as the gain amplifier and the DAC, are accurate then the reconstructed waveform of the output of the pipeline ADC will be the same at the analog input waveform 204.

As illustrated in graph 216 however, due to mismatches and errors in the analog components, the final digital output is not a smooth waveform like the analog input waveform 204. A comparison of the graph 210 with graph 216 demonstrates that the breaks 220 in the waveform 218 occur at the location depicting abrupt changes 222 in the residue corresponding to transition regions of the flash ADC 106. As discussed further below, abrupt changes 222 in residue corresponding to transition regions of the flash ADC 106 may be used to identify and correct mismatches and errors introduced by the analog components present in a stage of a pipeline ADC.

Figure 3:
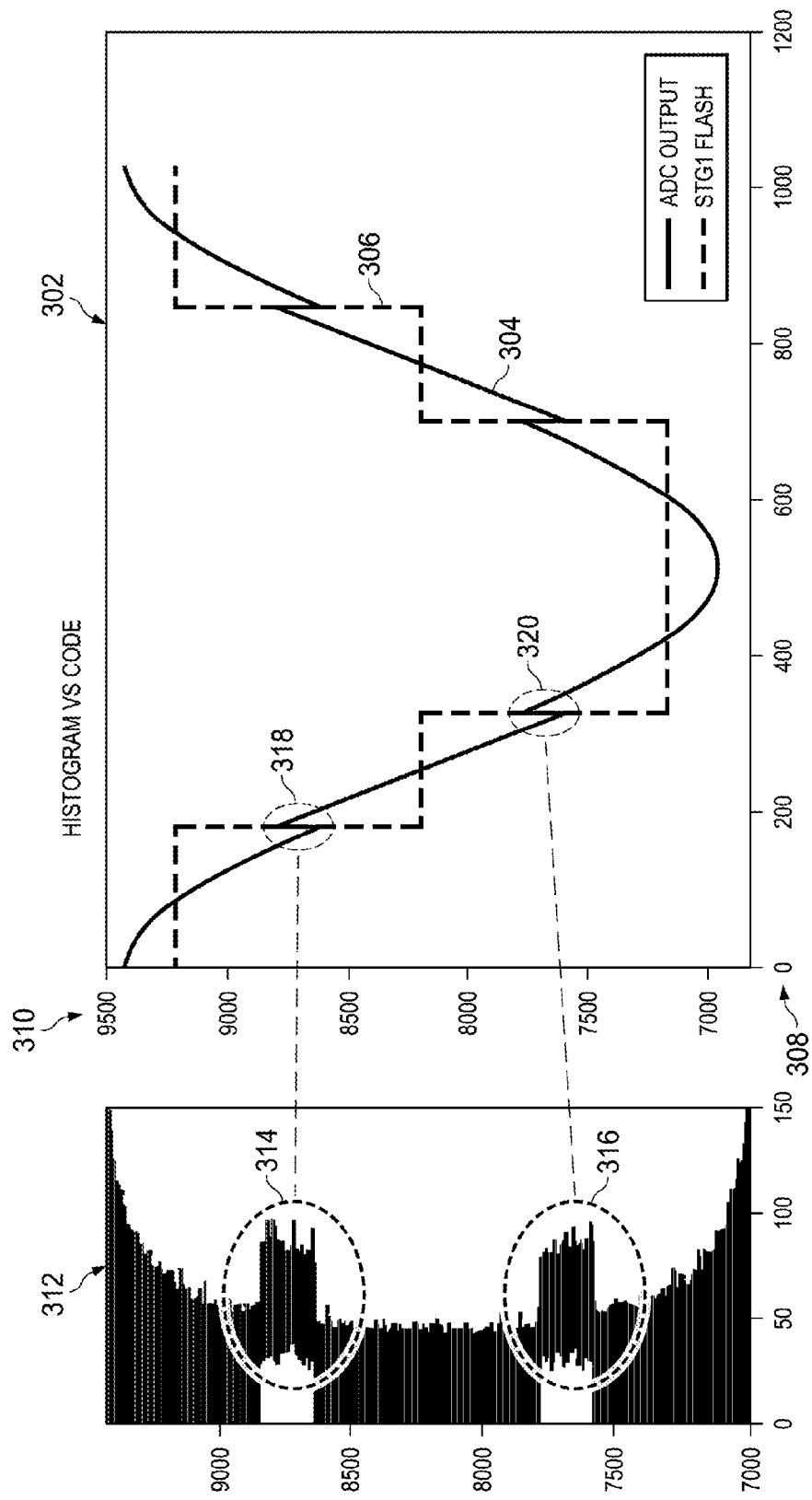
FIG. 3 illustrates a histogram and voltage waveforms during an operation of the ADC in accordance with various examples.

FIG. 3 illustrates a histogram and voltage waveforms during an operation of ADC 101 in accordance with various examples. In graph 302, an output of ADC 101 is shown as waveform 304, while the digital output of a flash ADC (e.g., flash ADC 106) is shown in waveform 306. Sample numbers are depicted along the x-axis 308 while a code output by the ADC is shown along the y-axis 310. As discussed previously, in embodiments where the ADC 101 is a pipeline ADC, disturbances in the pipeline ADC output occur in the regions where a flash ADC (e.g., flash ADC 106) in a particular stage (e.g., stage 102a) transitions.

A histogram 312 tracking the number of times a code is output in an interval of time by the pipeline ADC illustrates that particular codes occur more than others, such as in regions 314 and 316. The number of times a code is output in an interval of time depends on the time an analog input spends within the boundaries of a particular code. The regions 314 and 316 capture the occurrence of disturbances in the pipeline ADC output. Of note, in this example, it is known that these are disturbances introduced in the pipeline ADC output because the input analog waveform is known. For example, if the input analog waveform was not known, it would be difficult to determine whether the bumps 318 and 320 in the waveform reflect bumps occurring in the original analog signal or whether the bumps were caused by a mismatch in the analog components in the pipeline ADC. Accordingly, in situations where a input signal is unknown, additional information is needed to discern the errors introduced in to the final digital output waveform that coincide with a mismatch in the DAC (e.g., DAC 108) and gain amplifier (e.g., gain amplifier 112) in one or more stages of the pipeline ADC. Accordingly, in various embodiments, information from the introduction of a dither in the input signal, such as input signal 114a, may be used.

Figure 4:
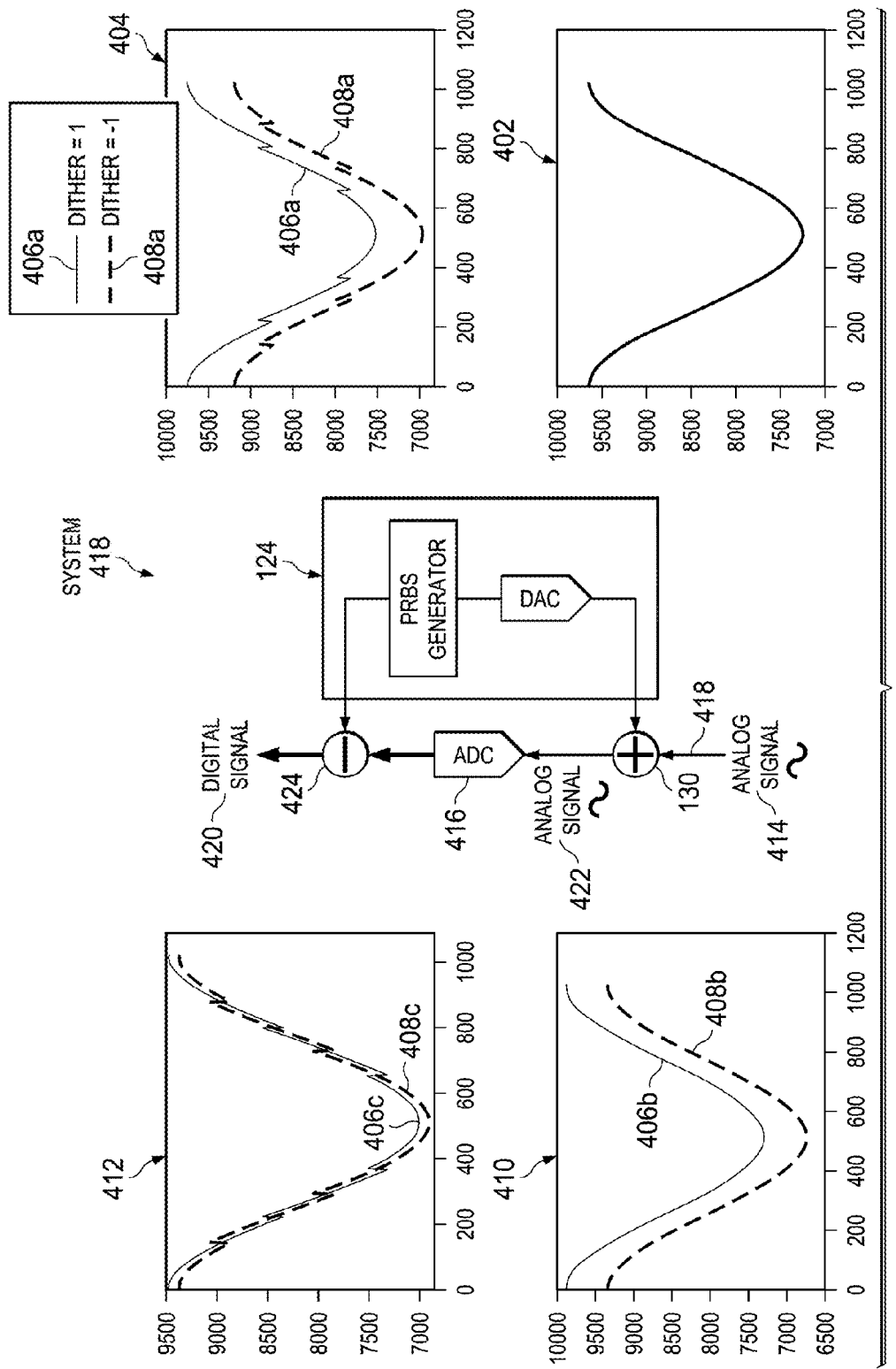
FIG. 4 illustrates voltage waveforms during an operation of the ADC in accordance with various examples.

FIG. 4 illustrates various waveforms present at various portions of the system 418 during an operation of the ADC 416 in system 418. System 418 comprises the ADC 416, which may be a pipeline ADC as discussed in FIG. 1 or may be a successive approximation ADC, flash ADC or other type of ADC. System 418 also includes the dither generator 124 (FIG. 1). In the graphs 402, 404, 410 and 412 samples numbers are shown along the x-axes of all the graphs 402, 404, 410, and 412 while code numbers corresponding to digital voltage values is shown along the y-axes of all the graphs 402, 404, 410, and 412. In various embodiments, an analog signal 414 enters the system 418 and is converted from an analog signal to a digital signal by the ADC 416 which outputs the digital signal 420.

Initially, the analog signal 414 may enter the system at input terminal 416. Graph 402 illustrates an example waveform of the analog signal 414. At the adder 130 a dither is added to the analog signal 414 to create a modified analog signal 422. The added dither may be a positive +1 dither or a negative −1 dither. Graph 404 shows example waveforms of a modified analog signal 422. Waveform 406a demonstrates how a positive +1 dither impacts the analog signal 414 while waveform 406b demonstrates how a negative −1 dither impacts the analog signal 414. As can be seen, the positive +1 dither shifts the analog signal 414 up while the negative −1 dither shifts the analog signal 414 down.

After the modified analog signal 422 is converted to a digital signal by the ADC 416, the resulting digital signals are shown in graph 410. In graph 410, waveform 406b depicts what the modified analog signal 406a (with a positive +1 dither) is converted to, and waveform 408b depicts what the modified analog signal 408a (with a negative −1 dither) is converted to. As can be seen in graph 410, mismatches in the analog components in the ADC 416, have introduced disturbances into the resulting waveforms 406b and 408b.

Various transfer characteristics may be observed in an ADC with gain errors and DAC mismatches. For example, when the gain is less than an ideal gain, some codes may occur less frequently than expected or be missing from an ADC output. Correspondingly, a histogram capturing the codes output by the ADC may reflect that these codes occurred less frequently or were missing. When the gain is greater than an ideal gain, some output codes may occur more frequently than others. A corresponding histogram may reflect these codes occurring more frequently than others. In scenarios where a DAC mismatch occurs, some output codes may occur more frequently or less frequently based on the mismatch in the DAC element.

At subtractor 424, the dither is removed from the converted digital signal and output as the digital signal 420. In various embodiments, the subtractor 424, may comprise a circuit that is capable of subtracting numbers in binary format. Graph 412 depicts waveforms 406c and 408c which correspond to waveforms 406b and 408c but without the added dithers. As can be seen, the removal of the positive +1 dither results in waveform 406b to be shifted down (waveform 406c) and the removal of the negative −1 dither results in waveform 408b to be shifted up (waveform 408c). The disturbances in the waveforms 406b and 408b are preserved after the dithers are removed, however, the disturbances occur at difference locations. Based on the type of dither that was added to the original analog signal 414, either a positive dither or a negative dither, the disturbances appear to occur at different codes.

Figure 5:
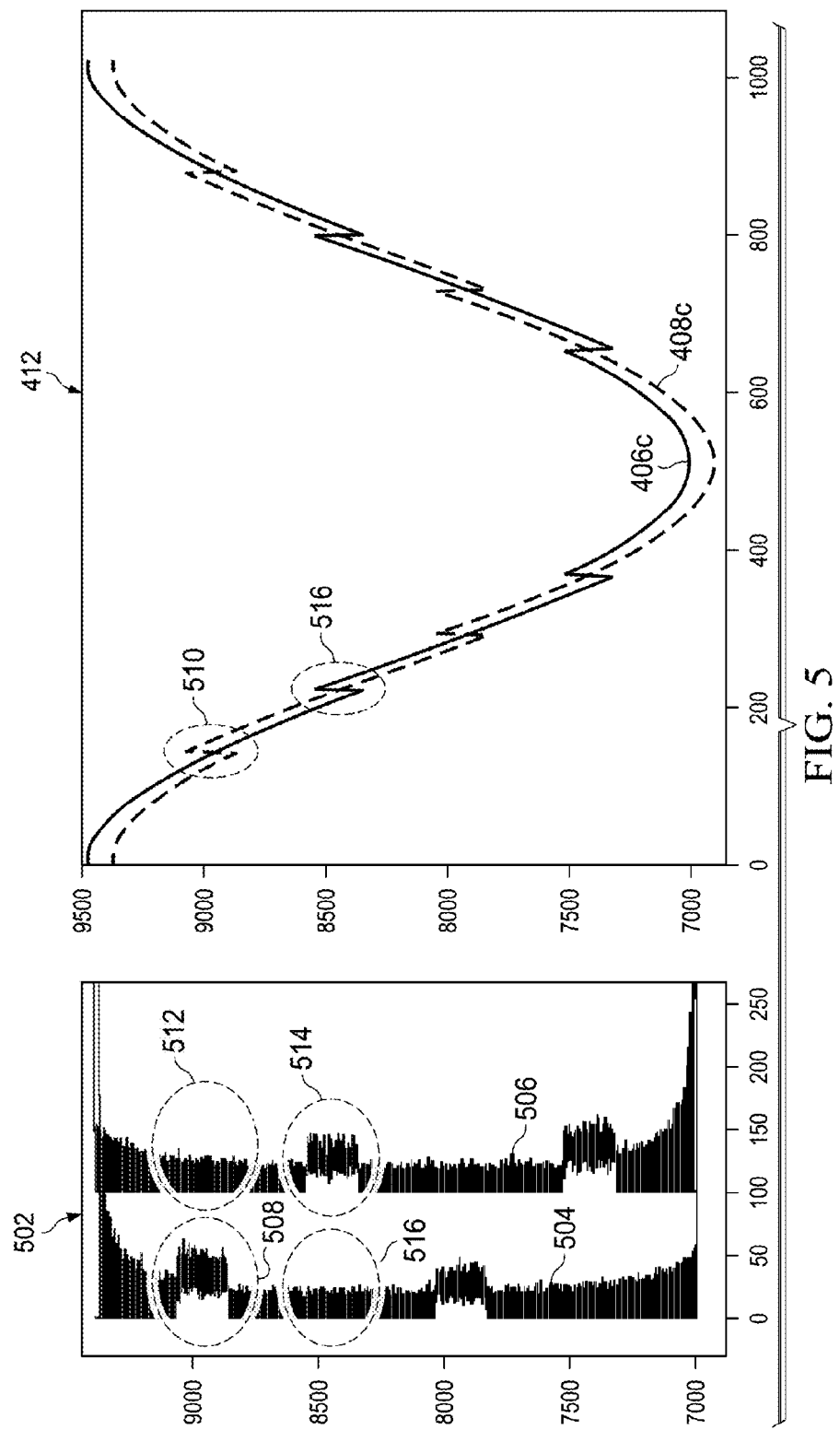
FIG. 5 illustrates histograms and corresponding voltage waveforms during an operation of the ADC in accordance with various examples.

FIG. 5 illustrates resulting histograms 502 of the waveforms depicted in graph 412 (FIG. 4). Histogram 504 captures quantities of a plurality of codes output by the ADC 416 (FIG. 4) when a negative −1 dither is added to the analog signal. Thus histogram 504 corresponds to the waveform 408c. Histogram 506 captures quantities of a plurality of codes output by the ADC 416 when a positive +1 dither is added to the analog signal. Thus histogram 506 corresponds to waveform 406c. Similar to the resulting histogram in FIG. 3, an increased number of codes can be seen in histogram 504 and 506 where there is a jump in the corresponding waveforms 406c and 408c. At locations where waveform 408c has a jump in the waveform, the waveform 406c is smooth and looks like the original analog signal and vice versa; at locations where waveform 406c has a jump in the waveform, the waveform 408c is smooth. In an example, where no errors are present in the digital output, both waveforms 406c and 408c would be lined up perfectly.

From this information, errors or disturbances may be corrected by comparing the resulting waveforms 406c and 408c to each other. However, a determination may be made initially as to which codes should be assessed to determine a direction of error correction. For example, as mentioned previously, in examples where the analog signal is known, it is easier to determine whether a resulting digital waveform has disturbances. In situations where the analog signal is unknown, information that disturbances are introduced when a flash ADC (e.g., flash ADC 106) transitions may be used to determine which data in the histogram is pertinent to assessing a direction or error correction. Accordingly, residue information corresponding to a flash ADC within a stage of the pipeline ADC may be used, as discussed in FIGS. 2 and 3.

For example, a flash transition region may be identified by comparing a plurality of residue data to identify regions where an abrupt change occurs in the residue data. Referring back to graph 210 (FIG. 2), regions 222 depict the abrupt change. Accordingly, an error correcting circuit such as the estimation circuit 126 may assess residue values to determine regions in which a difference between a residue value and a subsequent or preceding residue value is above a predetermined threshold.

In one example, based on residue information of a particular flash ADC in the pipeline ADC and in particular based on a determination of regions in the residue data with an abrupt change (corresponding to a flash ADC transition), a determination may be made that the flash ADC transitions around code 8900. Accordingly a region 508 around code 8900 may be defined based on the information gathered from the residue information. From this information, it may be determined that the difference between histograms 504 and 506 occurring in regions 504 and 512 are caused by the flash transition and are thus disturbances introduced into the digital output waveform, as opposed to reflecting an actual bump in the analog input signal. Accordingly, a direction of error correction may be determined based on a determination that region 512 of histogram 506 represents an ideal or target result. A direction of error correction may be assessed such that region 508 is corrected to more closely resemble region 512 of histogram 506.

In another example, based on a determination of regions in the residue data with an abrupt change (corresponding to another flash ADC transition), another determination may be made that the flash ADC transitions around code 8400. Accordingly a region 514 of histogram 506 and a region 516 of histogram 504 around code 8400 may be defined based on the information gathered from the residue information. From this information, it may be determined that the difference between histogram 504 and 506 occurring in regions 516 and 514 are caused by the flash transition. Accordingly, a direction of error correction may be determined based on a determination that region 516 of histogram 504 represents an ideal or target result. A direction of error correction may be assessed such that region 514 of histogram 506 is corrected to more closely resemble region 516 of histogram 504.

Accordingly, in examples where jumps, such as jumps 510 and 516 are present, information on the perfect of gain error in the ADC 416 may be determined. Additionally, information gathered from modified signal with a positive dither may be used to correct a resultant waveform from a modified signal with a negative dither and vice versa.

Thus, in embodiments where ADC 416 comprises a pipeline ADC, the region of computation and integration (e.g., 508, 512, 514, or 516) may be determined based on regions where the flash ADC in a stage of the pipeline ADC transitions. For other architectures of the ADC 416, the region of computation and integration may be different. The region of computation and integration may exist in any region where errors due to imperfections in analog components occur; thus these errors are caused by the analog components of the ADC 416.

Figure 6:
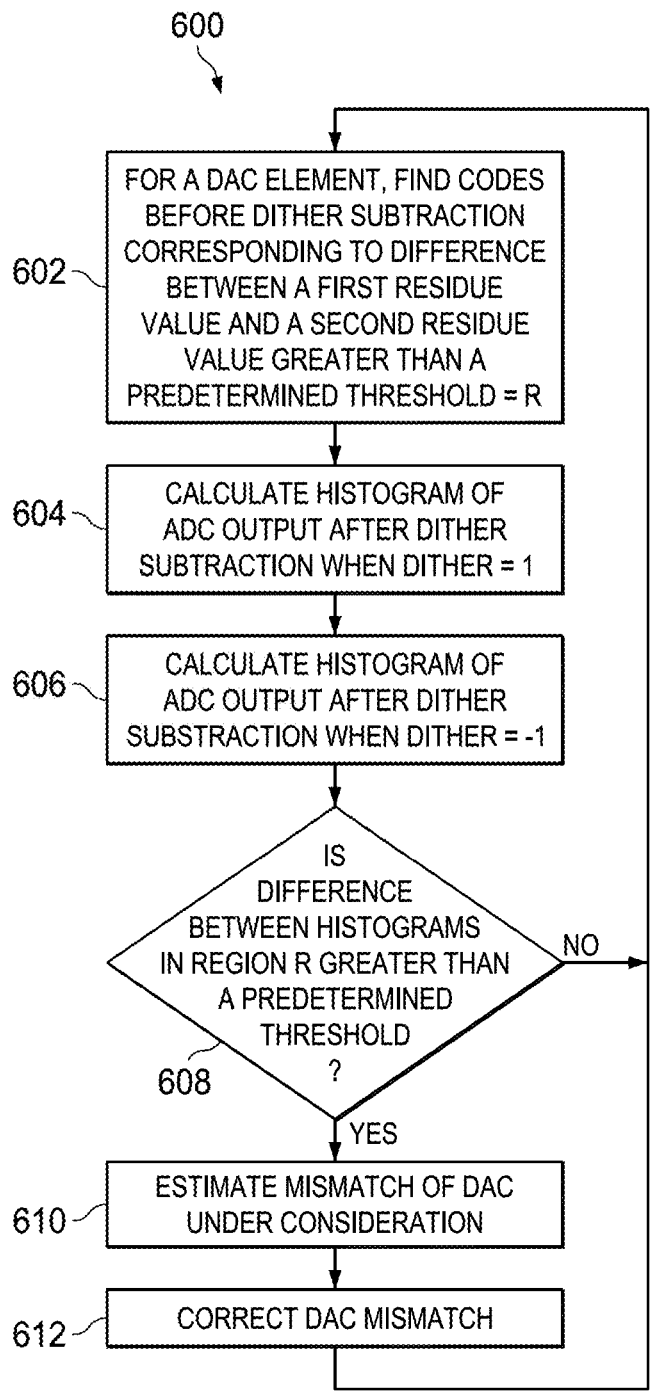
FIG. 6 shows a method in accordance with various examples.

FIG. 6 illustrates an example method 600 in accordance with various embodiments. In various embodiments, some of the blocks shown in FIG. 6 may be performed concurrently, in a different order than show, or omitted. Additional method elements may be performed as desired.

At block 602, for a particular DAC element (i.e., DAC 108), codes may be found or determined before dither subtraction corresponding to a difference between a first residue value and a second residue value being greater than a predetermined threshold and these codes may be denoted as within a region R. That is codes may be identified where an abrupt change occurs in residue values. In some embodiments, a determination may be made of a region in which an output of the flash ADC changes based on a plurality of residue data of the flash ADC. In various embodiments, a hardware processor of an estimation circuit 126 may determine the codes and the region R.

At block 604, the estimation circuit 126, and more particularly a hardware processor of the estimation circuit 126 may calculate a histogram of the ADC output after dither subtraction when the dither is a positive +1 dither (i.e., histogram 506). In some embodiments, this occurs after converting a first modified input signal including a first analog signal combined with a first dither to a first digital signal. Next an estimation circuit 126 may generate a first histogram comprising a plurality of codes generated by the ADC corresponding to the first digital signal without the first dither.

At block 606, the estimation circuit 126 may calculate a histogram of the ADC output after dither subtraction when the dither is a negative −1 dither (i.e., histogram 504). In some embodiments, this occurs after converting a second modified input signal including a second analog signal combined with a second dither to a second digital signal. Next an estimation circuit 123 may generate a second histogram comprising a plurality of codes generated by the ADC corresponding to the second digital signal without the second dither.

At decision block 608, a determination is made as to whether a difference between histograms in a region R is greater than a predetermined threshold. This difference may be greater than a predetermined threshold for example between regions 508 and 512. If the difference is not greater than a predetermined threshold, for example, the histograms in a particular region have around the same quantity of each code in the defined region R, then the flow proceeds back to block 602.

If the difference is greater than a predetermined threshold, then the flow proceeds to block 610 in which the estimation circuit 126 may estimate the mismatch of the DAC under consideration. At block 612, the DAC mismatch may be corrected. Thus, by using an output code histogram and analog dither together an estimation of the DAC mismatch and gain error may be deduced without knowledge of the analog signal received at the input of the pipeline ADC. Additionally, by using two regions of R (one obtained from the analog signal modified by the positive +1 dither and one obtained from the analog signal modified by the negative −1 dither) a convergence time may be reduced (i.e., convergence time have be halved). Additionally, by assessing residue information of a flash ADC, regions of computing the histogram may be determined.

Figure 7:
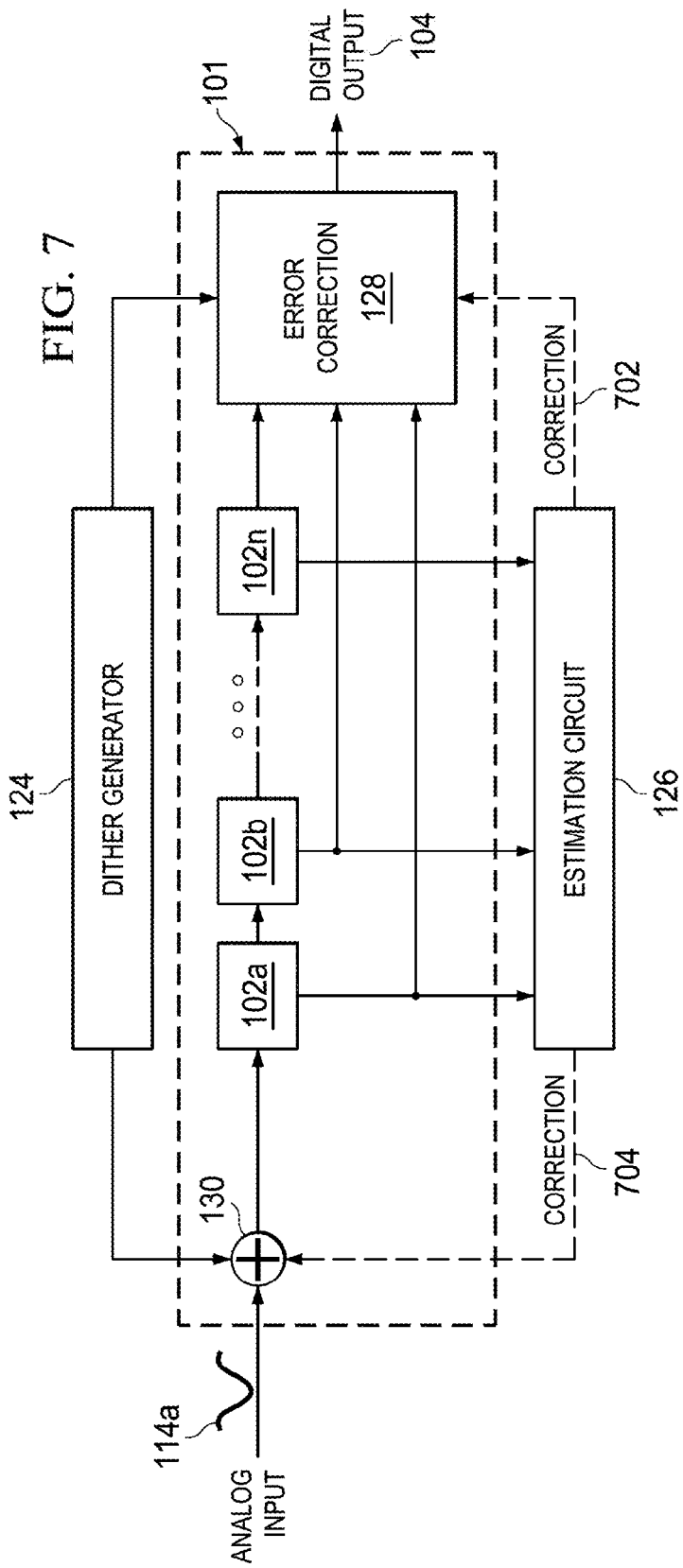
FIG. 7 illustrates additional detail of error correction provided to the ADC in accordance with various examples.

As shown in FIG. 7, error correction may occur in both the digital domain or in the analog domain. If the error correction is implemented as a digital correction, the correction 702 may be transmitted by the estimation circuit 126. Alternatively, if the error correction is implemented as an analog correction, the correction 704 may be transmitted by the estimation circuit 126. In various embodiments implementing error correction 704 in the analog domain, the estimation circuit 126 may need to accurately predict the correction to be applied to the analog signal 114*a*. In the digital domain, error correction 702 may indicate a direction or correction to apply. Instead of estimating mismatch, the sign of the error may be estimated and corrected. Computation requirements may be reduced if the error correction is done in the digital domain, as an exact correction need not be calculated from the histograms (as would be done for error correction in the analog domain). Thus, implementing an error correction in the digital domain may result in reduced hardware overall in the system.

In various embodiments, the calibration and correction implemented by estimation circuit 126 is done in the background. Thus an operation of the ADC is not interrupted or stalled as the calculations and corrections are implemented. An error correction may be applied and an estimation circuit 126 may check subsequent histogram data in conjunction with residue data to determine whether additional corrections are needed.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system comprising:
an analog-to-digital converter (ADC) comprising:
an ADC input terminal,
an ADC output terminal, and
analog components configured to convert an analog signal received at the ADC input terminal to a digital signal;
a dither circuit coupled to the ADC input terminal and configured to introduce a dither in the analog signal to generate a modified analog signal; and
a histogram estimation circuit coupled to an output of the ADC and configured to determine a direction of error correction based on information provided by the introduction of the dither in the analog signal and information of a plurality of codes output by the ADC in a target region.

2. The system of claim 1, wherein the histogram estimation circuit is further configured to:
receive a first and second signal in digital format from the ADC, the first and second signal in digital format correspond to a respective first and second analog signal received at the ADC input terminal, wherein a first and second dither is being added to the first and second analog signal respectively;
calculate a first histogram of digital values corresponding to the first signal without the first dither;
calculate a second histogram of digital values corresponding to the second signal without the second dither;
compare the first and second histograms at the target region corresponding to an occurrence of an error caused by the analog components of the ADC; and
determine an error correction based on the comparison of the first and second histogram.

3. The system of claim 2,
wherein a portion of the first histogram represents a target histogram,
wherein a portion of the second histogram represents an actual histogram, and
wherein the histogram estimation circuit configured to determine the error correction comprises the histogram estimation circuit configured to apply a correction to an analog component of the analog components such that a difference between the target histogram and the actual histogram is reduced.

4. The system of claim 1,
wherein the dither circuit is further configured to introduce a positive dither to the analog signal to generate a positive modified analog signal;
wherein the ADC is configured to convert the positive modified analog signal to a positive modified digital signal; and
wherein the histogram estimation circuit is configured to subtract the positive dither from the positive modified digital signal and generate a first histogram of a plurality of codes generated by the ADC corresponding to the positive modified digital signal without the positive dither.

5. The system of claim 4,
wherein the dither circuit is further configured to introduce a negative dither to the analog signal to generate a negative modified analog signal;
wherein the ADC is configured to convert the negative modified analog signal to a negative modified digital signal; and
wherein the histogram estimation circuit is configured to subtract the negative dither from the negative modified digital signal and generate a second histogram of a plurality of codes generated by the ADC corresponding to the negative modified digital signal without the negative dither.

6. The system of claim 5, wherein the target region corresponds to a first range of codes of the first histogram, wherein the histogram estimation circuit is further configured to:
compare a plurality of codes between the first histogram and the second histogram at the first range of codes; and
determine the direction of error correction based on the comparison.

7. The system of claim 5, wherein the target region corresponds to a first range of codes of the first histogram and a second range of codes of the second histogram, wherein the histogram estimation circuit is further configured to:
compare a plurality of codes between the first histogram and the second histogram within the first range of codes to determine an error correction based on the first comparison; and compare a plurality of codes between the first histogram and the second histogram within the second range of codes to determine an error correction based on the second comparison.

8. The system of claim 7, wherein the histogram estimation circuit is further configured to reduce a convergence time for error correction by determining an error correction based on the first comparison and an error correction based on the second comparison.

9. The system of claim 1, wherein the ADC comprises a pipeline ADC comprising at least two stages, one of the at least two stages comprising:
   a flash ADC comprising a flash ADC input terminal and a flash ADC output terminal, the flash ADC input terminal configured to receive the analog signal;
   a digital to analog converter (DAC) comprising a DAC input, the DAC input coupled to the ADC output terminal; and
   a subtractor configured to subtract an output signal of the DAC from the analog signal to generate a residue signal.

10. A system comprising:
   a pipeline analog-to-digital converter (ADC) comprising at least two stages, one of the at least two stages comprising:
      a flash ADC comprising an input configured to receive an analog signal,
      a digital-to-analog converter (DAC), comprising a DAC input configured to receive a digital signal from the flash ADC, and
      a gain amplifier configured to amplify a difference between an output signal from the DAC and the analog signal;
   a dither circuit coupled to the input of the pipeline ADC and configured to introduce a dither in the analog signal to generate a modified analog signal; and
   an estimation circuit coupled to an output of the pipeline ADC and configured to determine a direction of error correction based on information provided by the introduction of the dither in the analog signal and information of a plurality of codes output by the pipeline ADC in a target region.

11. The system of claim 10, wherein the estimation circuit is further configured to determine the direction of error correction through a background calibration without interruption of an operation of the pipeline ADC.

12. The system of claim 10, wherein the estimation circuit comprises a hardware processor, the hardware processor configured to:
   receive a first signal from the pipeline ADC, the first signal comprising a digital signal corresponding to the modified analog signal comprising a first dither;
   receive a second signal from the pipeline ADC, the second signal comprising a second digital signal corresponding to a second modified analog signal comprising a second dither;
   determine a range of codes comprising a region corresponding to a transition region of the flash ADC;
   calculate a first histogram of pipeline ADC output signal values corresponding to the first signal without the first dither;
   calculate a second histogram of pipeline ADC output signal values corresponding to the second signal without the second dither;
   compare the first histogram and second histogram at the region corresponding to a transition region of the flash ADC; and
   determine the direction of error correction based on the comparison of the first histogram and second histogram.

13. The system of claim 12, wherein the hardware processor is further configured to determine the direction of error correction through a determination of a direction that reduces a difference between the first histogram and the second histogram.

14. The system of claim 10,
   wherein the dither circuit is further configured to introduce a positive dither in the analog signal to generate the modified analog signal;
   wherein the pipeline ADC is configured to convert the modified analog signal to a modified digital signal; and
   wherein the estimation circuit subtracts the positive dither from the modified digital signal and generates a first histogram of a plurality of codes corresponding to an output signal generated by the pipeline ADC corresponding to the modified digital signal.

15. The system of claim 14,
   wherein the dither circuit is further configured to introduce a negative dither in a second analog signal to generate a second modified analog signal;
   wherein the pipeline ADC is configured to convert the second modified analog signal to a second modified digital signal; and
   wherein the estimation circuit subtracts the negative dither from the second modified digital signal and generates a second histogram of a plurality of codes corresponding to the output signal generated by the pipeline ADC corresponding to the second modified digital signal.

16. The system of claim 15, wherein the estimation circuit is further configured to:
   determine the region in which an output of the flash ADC changes based on a plurality of residue data of the flash ADC, wherein the plurality of residue data is calculated based on a difference between a code of the flash ADC and a corresponding voltage level of the analog signal;
   compare a plurality of codes between the first histogram and the second histogram at the region; and
   wherein determining the direction of error correction further comprises determining based on the comparison between the first and second histograms.

17. The system of claim 16, wherein determining the region further comprises identifying the region in which a difference between a first residue data of the plurality of residue data and a second residue data of the plurality of residue data is above a threshold.

18. A method of correcting errors in analog components of an analog-to-digital converter (ADC), the method comprising:
   converting a first modified input signal comprising a first analog signal combined with a first dither to a first digital signal;
   converting a second modified input signal comprising a second analog signal combined with a second dither to a second digital signal;
   generating a first histogram comprising a plurality of codes generated by the ADC corresponding to the first digital signal without the first dither;
   generating a second histogram comprising a plurality of codes generated by the ADC corresponding to the second digital signal without the second dither;
   determining a region in which an output of a flash ADC of the ADC changes based on a plurality of residue data of the flash ADC; and determining a direction of error correction based on the comparison of a plurality of codes between the first histogram and the second histogram at the region.

19. The method of claim 18, wherein determining the region in which an output of the flash ADC changes further comprises identifying a range of codes in which a difference between a first residue data of the plurality of residue data and a second residue data of the plurality of residue data is above a threshold.

20. The method of claim 18,
wherein the first dither comprises a positive dither, and
wherein the second dither comprises a negative dither.

\* \* \* \* \*